(12) United States Patent
Kohno

(10) Patent No.: US 6,664,640 B2
(45) Date of Patent: Dec. 16, 2003

(54) SEMICONDUCTOR DEVICE

(75) Inventor: Junko Kohno, Kanagawa (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 10/199,592

(22) Filed: Jul. 19, 2002

(65) Prior Publication Data

US 2003/0020174 A1 Jan. 30, 2003

(30) Foreign Application Priority Data

Jul. 30, 2001 (JP) ........................................ 2001-230436

(51) Int. Cl.[7] .............................................. H01L 29/40
(52) U.S. Cl. ...................... 257/774; 257/751; 257/763; 257/764
(58) Field of Search ................................ 257/751, 750, 257/758, 177, 178, 675, 706, 720, 774, 276, 625, 638, 783, 763, 764

(56) References Cited

U.S. PATENT DOCUMENTS

| | | | | |
|---|---|---|---|---|
| 4,589,961 A | * | 5/1986 | Gershenson | 204/15 |
| 5,471,092 A | * | 11/1995 | Chan et al. | 257/753 |
| 5,614,756 A | * | 3/1997 | Forouhi et al. | 257/530 |
| 6,015,980 A | * | 1/2000 | Bowers et al. | 257/743 |

FOREIGN PATENT DOCUMENTS

| | | |
|---|---|---|
| GB | 2 285 174 A | 6/1995 |
| JP | 59-117171 | 7/1984 |
| JP | 61-79261 | 4/1986 |
| JP | 02-148739 | 6/1990 |
| JP | 02-214127 | 8/1990 |
| JP | 5-47937 | 2/1993 |
| JP | 07-058132 | 3/1995 |
| JP | 7-176760 | 7/1995 |
| JP | 7-193122 | 7/1995 |
| JP | 07-193214 | 7/1995 |

* cited by examiner

Primary Examiner—Jasmine Clark
(74) Attorney, Agent, or Firm—Hayes Soloway P.C.

(57) ABSTRACT

A semiconductor apparatus comprising: a semiconductor substrate; a first surface of the semiconductor substrate on which a semiconductor device is formed; a second surface opposite to the first surface of the semiconductor substrate; a via hole penetrating through the semiconductor substrate from the first surface to second surface; an electrode, provided on the second surface, connecting to the via hole; wherein the electrode having a barrier layer for preventing any diffusion of a soldering material into the via hole.

18 Claims, 9 Drawing Sheets

US 6,664,640 B2

SEMICONDUCTOR DEVICE

BACKGROUND OF THE INVENTION

1. Field of the Invention

The present invention relates to a semiconductor device having a via hole (a through hole) which is formed penetrating through a semiconductor substrate so as to be electrically connected to a reverse of the substrate, or a semiconductor device having a plated heat sink (abbreviated to "PHS") layer for heat radiation and stress alleviation at a reverse of the semiconductor substrate.

2. Description of the Related Art

In an analog integrated circuit of a high frequency or a high output amplifying device made of a field-effect transistor (FET), a hetero-bipolar transistor (HBT) or the like, there are formed a via hole (a through hole) penetrating a substrate and a penetrating metal of an electric conductor inside of the via hole in order to ground from a circuit device formed on the semiconductor chip with a low impedance, and thus, they are electrically connected to a back electrode disposed over the entire reverse of the semiconductor chip, thereby achieving the grounding.

In this case, although a metal wire may be used for the purpose of the grounding, the wiring becomes long, so that an inductance component or a resistance component is increased, resulting in abnormal oscillation in an unstable state.

In view of this, the semiconductor chip is connected directly to the back electrode through the substrate at a short distance for the purpose of the grounding, thereby suppressing the component of the inductance or resistance to a low level. Thereafter, the semiconductor chip is securely bonded at the metallic reverse thereof to a metallic surface of a package substrate, a package or the like with a metallic soldering material (a solder), thus ensuring the grounding.

In the meantime, a wiring pad provided on the semiconductor chip and a terminal of the package substrate, the package are connected to each other by bonding via a metal wire.

The structure of a semiconductor apparatus having such via hole is disclosed in, for example, Japanese Unexamined Patent Publication (KOKAI) Nos. 59-117171, 61-79261 and 5-47937.

FIG. 7 is a cross-sectional view schematically showing the structure of a semiconductor apparatus (a semiconductor chip) shown in the prior art; and FIG. 8 is a cross-sectional view illustrating the state in which the semiconductor chip in the prior art, shown in FIG. 7, is bonded to a package metal mount such as a package with a soldering material.

In the semiconductor chip shown in FIG. 7, a semiconductor device of a field-effect transistor (FET) is disposed at the obverse of a semiconductor substrate 1 made of semi-insulating GaAs.

That is to say, a device region formed of an n-type GaAs conductive layer 2 is disposed at the obverse of the semiconductor substrate 1 made of semi-insulating GaAs. Furthermore, on the GaAs conductive layer 2 are formed a Schottky gate electrode 5, and a source electrode 3 and a drain electrode 4 which sandwich the gate electrode 5 therebetween. The semiconductor device is covered with an insulating film 7 made of $SiO_2$ or the like.

Moreover, a through a hole (i.e., via hole) 6 penetrating the semiconductor substrate 1 from the obverse thereof down to the reverse thereof is formed near the source electrode 3. As penetrating metals for connecting so as to ground the source electrode 3 to the reverse are laminated a titanium (Ti) layer 9, a gold (Au) layer 10 and an Au-plating layer 12 on the inner wall of the via hole 6.

On the other hand, a Ti layer 30, an Au layer 31 and an Au-plating layer 32 are laminated in this order in contact with the penetrating metals of the via hole 6 as a back electrode also over the entire reverse of the semiconductor substrate 1.

FIG. 8 illustrates an example of the arrangement in which the Au-plating layer 32 at the reverse of the semiconductor chip shown in FIG. 7 is bonded onto a metal mount having a package, a lead frame, a package substrate with a soldering material 18 made of gold tin (AuSn) or the like. The metal mount is made of copper (Cu) plated with Au.

Here, the source electrode 3 is connected to the back electrode via the penetrating metal of the via hole 6, and further, the back electrode is connected to a metal mount 19 via the conductive soldering material 18. Consequently, the source electrode 3 is grounded to the earth.

Each of the Ti layers 9 and 30 used herein is formed so as to enhance a contact property since Au is poor in contact property with respect to the semiconductor substrate. In addition, each of the Ti layers 9 and 30 is formed as thinly as, for example, in about 100 nm so as not to increase resistance.

In other words, the Ti layers in the above-described prior art never have the function of a barrier layer, which is used according to the present invention, described later.

In the meantime, the Au layer 31 laminated on the Ti layer 30 is formed as a power supplying layer for applying Au plating in the thickness of about 100 to 500 nm. The Ti layer and the Au layer are formed by sputtering vapor deposition or electron gun vapor deposition.

The wiring at the obverse and the Au-plating layer 32 of the penetrating metal are formed in the thickness of about 0.5 $\mu$m to 30 $\mu$m. Only the Au layer 31 formed by the vapor deposition can secure conductivity without using Au-plating layer 32.

Additionally, the thickness of the Au layer 31 or the Au-plating layer 32 in the back electrode approximately ranges from 0.5 $\mu$m to 30 $\mu$m. Since a device of low power consumption for low noise amplification or the like is enough to merely secure the close contact with the soldering material, the Au layer 31 or the Au-plating layer 32 is formed in the thickness of about 0.5 $\mu$m by the sputtering vapor deposition or the like without applying any Au plating.

In contrast, the Au-plating layer 32 is thickly formed in a device of high power consumption for high output amplification.

Otherwise, in the above-described prior art, it is necessary to thin the semiconductor substrate in order to enhance a heat radiating property in a semiconductor device of large heat generation. Therefore, it is general to dispose a heat sink layer having a heat radiating function at the reverse of the semiconductor substrate in order to reinforce the physical strength of a chip or alleviate a stress in the case in which a stress occurs between the semiconductor substrate and the metal mount or the soldering material caused by expansion of the semiconductor substrate. Such a heat sink layer is called also a PHS (plated heat sink) layer.

In general, although gold (Au), which is soft and excellent in heat conductivity and electric conductivity, has been mostly used as such a heat sink layer, copper (Cu), which is inexpensive, soft and excellent in heat conductivity and electric conductivity, has been used in recent years.

In the prior art, gold tin (Au—Sn) composed of gold added with about 20% of tin has been mostly used as the soldering material for fixing the semiconductor chip to the metal mount in the case where the heat sink layer requires the reliability, and the melting point of the soldering material for fixing the semiconductor chip is set to as high as 300° C. to 400° C. since there are heating works thereafter such as heating in bonding, cap sealing for the package, formation of a mold resin or soldering of the package to a circuit board. As the soldering material may be used a lead tin (Pb—Sn) or zinc tin (Zn—Sn) based soldering material.

Subsequently, explanation will be made on a method for fabricating the semiconductor chip having the via hole and the PHS layer.

FIGS. 9 to 15 are schematically cross-sectional views showing, in sequence, one example of a method for fabricating the semiconductor apparatus in the prior art.

First of all, as shown in FIG. 9, the n-type conductive layer 2 is epitaxially grown on the semi-insulating GaAs substrate 1 having the thickness of about 600 $\mu$m. A region except for the device is removed by etching or the like, thereby forming the n-type conductive layer 2 serving as the device region. On the n-type conductive layer 2 are formed the Schottky gate electrode 5, and the source electrode 3 and the drain electrode 4, which are ohmic.

Furthermore, the semiconductor device is covered by accumulating the insulating film 7 made of $SiO_2$ or the like serving as a protective film.

Moreover, a photoresist film 8 having an opening pattern is formed on the insulating film 7. Thereafter, the via hole 6 is formed, for example, having a diameter of about 40 $\mu$m and a depth of 100 $\mu$m on the GaAs substrate 1 by dry etching with gaseous chloride.

After the etching, as shown in FIG. 10, the photoresist film 8 formed at the obverse is removed, and further, the side of the insulating film 7 is etched in about 10 $\mu$m, thereby exposing a part of the source electrode 3. On the exposed source electrode 3, the Ti layer 9 having the thickness of 100 nm and the Au layer 10 having the thickness of 400 nm are formed in sequence by sputtering vapor deposition. The Au layer 10 is a power supplying layer for plating, and the Ti layer 9 is a layer for bringing Au layer 10 into close contact.

Next, as shown in FIG. 11, another photoresist film 11 opened continuously to the via hole 6 and a part of the source electrode 3 is formed as a mask, and further, the Au plating layer 12 as the wiring is formed in the thickness of 3 $\mu$m. Thereafter, the photoresist film 11 used as the mask for the plating is removed.

Subsequently, the Au layer 10 and the Ti layer 9 except for the wiring are removed by ion milling or the like while using the Au plating layer 12 per se as a mask.

And then, after the semiconductor device and the wiring are formed on the GaAs substrate 1, the obverse of the GaAs substrate 1 is stuck to a support plate 14 made of quartz or the like via a wax 13. Thereafter, the reverse of the GaAs substrate 1 is polished, so that the GaAs substrate 1 is thinned down to 100 $\mu$m, thereby exposing the metal at the bottom inside of the via hole 6. Variations in thickness of the substrate by polishing are measured by detecting positional variations of a support rod for pressing the substrate against the polished surface.

Subsequently, as shown in FIG. 13, a Ti layer 15 in the thickness of 100 nm and an Au layer 16 in the thickness of 400 nm as a back electrode are vapor-deposited by sputtering at the reverse of the GaAs substrate 1. Incidentally, in the case of the semiconductor device of low power consumption for low noise, the semiconductor device may be cut out into semiconductor chips in this state by dicing or the like.

Next, as shown in FIG. 14, a thick photoresist film serving as a mask is formed on the reverse of the GaAs substrate 1 and in a chip cutting region, and then, the Au layer 16 as a power supplying layer is subjected to Au plating in the thickness of 20 $\mu$m, thereby forming a PHS layer 23.

Subsequently, as shown in FIG. 15, the Au layer 16 and the Ti layer 15 in the cutting region are removed by ion milling or the like while using the PHS layer 23 as a mask, and further, the GaAs substrate 1 is chipped by dry etching or wet etching, or chipped by dicing.

Thereafter, the reverse is stuck to an adhesive tape, to be separated from the support plate 14 by dissolving the wax 13. The adhesive tape is laterally extended by heat, so that the interval between the chips is enlarged so as to obtain semiconductor chips one by one, thus providing the semiconductor chip (i.e., the semiconductor apparatus) shown in FIG. 7.

In the meantime, FIGS. 16 and 17 illustrate one specific example of a method for fabricating a heat sink layer 21 on the reverse of the substrate in the semiconductor apparatus in the prior art. A mask made of a thick photoresist film 20 is formed on the reverse of the substrate in the semiconductor device, which is formed in reference to FIG. 12, in the chip cutting region, as shown in FIG. 16, thereby forming the heat sink layer 21.

Thereafter, as shown in FIG. 17, the GaAs substrate 1 in the cutting region is chipped by dry etching or wet etching or chipped by dicing while using the PHS layer 21 as the mask.

In Japanese Unexamined Patent Publication (KOKAI) No. 61-79261, a Ti contact layer having a thickness of 100 nm is provided.

Alternatively, Japanese Unexamined Patent Publication (KOKAI) No. 7-193214 discloses the use of Ti, Cr or Ni having the thickness of 50 nm or less as a contact layer. Otherwise, Japanese Unexamined Patent Publication (KOKAI) No. 7-58132 discloses the use of a Ti layer having the thickness of 50 nm, and Japanese Unexamined Patent Publication (KOKAI) No. 7-176760 also discloses the use of a Ti layer having the thickness of 50 nm as a contact layer.

In this way, since Au per se is poor in contact property with respect to the substrate, a metal such as Ti is thinly formed in the thickness of 100 nm or less, thereby securing the contact property.

When the above-described semiconductor chip is boned to the metal surface of the package or the like with the soldering material which is heated and fused, in particular, the Au layer of the back electrode is thin, Sn or the like contained in the soldering material is diffused in the Au layer or the Ti layer, and further, is diffused and is impregnated into the via hole. When the heating is stopped and the temperature returns to room temperature, a crack occurs from the via hole, thereby arising a problem of breakage or deterioration of the semiconductor device or the circuit wiring having the crack at the surface thereof.

This is because Sn is excellent in wettability with respect to the metal, and therefore, Sn is diffused in the metal to readily produce an alloy. The alloyed metal is generally liable to be easily hardened.

In view of these, it is construed that the soldering material impregnated in the via hole is hardened by alloying, and thus, the crack occurs on the semiconductor substrate.

The resistance is increased in the alloyed portion, thereby reducing a drain current or degrading the device characteristics.

Additionally, also in the case in which the heat sink layer is formed on the reverse in the above-described semiconductor apparatus in the prior art, the soldering material is impregnated into the member constituting the heat sink layer, which is then hardened or denatured, resulting in lack of flexibility. Thus, there arises a problem that a distortion alleviating function is lost or heat conductivity is deteriorated to degrade a heat radiation effect.

In addition, Japanese Unexamined Patent Publication (KOKAI) No. 2-214127 discloses the technique of covering to enclose a dicing region with a heat radiating electrode disposed at the reverse of a substrate for the purpose of prevention of generation of an edge in dicing the substrate; and Japanese Unexamined Patent Publication (KOKAI) No. 2-148739 discloses the technique of removing an undercoating layer for a heat radiating electrode so as to expose a dicing region of a substrate after the formation of a heat radiating electrode for the purpose of accurate dicing in dicing by etching. Neither of the above-described prior art discloses the technique of disposing a barrier layer for preventing any diffusion of the plating component in the plating process.

Moreover, Japanese Unexamined Patent Publication (KOKAI) No. 7-193122 discloses the technique of dry-etching a device separating region for the purpose of preventing any generation of gaps or bubbles inside of a sticking member in sticking a semiconductor apparatus onto a support mount made of glass or the like, but does not disclose the technique of disposing a barrier layer for preventing any diffusion of the plating component in the plating process.

SUMMARY OF THE INVENTION

The present invention has been accomplished in an attempt to solve the above problems and overcome the drawbacks experienced in the prior art. It is an object of the present invention to provide a semiconductor apparatus having a via hole capable of excellently keeping the characteristics of a semiconductor device formed on an obverse of a semiconductor substrate without any occurrence of breakage such as a crack on the semiconductor substrate, or a semiconductor apparatus in which the reliability of a back electrode member including a heat sink layer cannot be degraded.

In order to achieve the above-described object, the present invention adopts technical arrangements described below.

Namely, a first aspect of the present invention is a semiconductor apparatus comprising: a semiconductor substrate; a first surface of the semiconductor substrate on which a semiconductor device is formed; a second surface opposite to the first surface of the semiconductor substrate; a via hole penetrating through the semiconductor substrate from the first surface to second surface; an electrode, provided on the second surface, connecting to the via hole; wherein the electrode having a barrier layer for preventing any diffusion of a soldering material into the via hole.

In a second aspect of the present invention, the electrode comprises a plurality of conductive metal layers.

In a third aspect of the present invention, the electrode comprises a metal junction layer which enhances a solder wettability of the barrier layer.
comprises electrode comprises a Ti film layer formed on the second surface of the semiconductor substrate, the barrier layer formed on the Ti film layer and a metal junction layer for enhancing a solder wettability of the barrier layer.

In a fifth aspect of the present invention, the barrier layer is composed of at least one selected from the group consisting of vanadium (V), chromium (Cr), zirconium (Zr), niobium (Nb), molybdenum (Mo), ruthenium (Ru), rhodium (Rh), tantalum (Ta), tungsten (W), rhenium (Re), osmium (Os), iridium (Ir), platinum (Pt), silicides thereof and nitrides thereof.

In a six aspect of the present invention, the metal junction layer is bonded to a package of a semiconductor apparatus a via solder layer.

A seventh aspect of the present invention is a semiconductor apparatus comprising: a semiconductor substrate; a first surface of the semiconductor substrate on which an FET is formed; a second surface opposite to the first surface of the semiconductor substrate; a via hole penetrating through the semiconductor substrate from the first surface to second surface and connecting to a source electrode of the FET; an electrode, provided on the second surface, connecting to the via hole; wherein the electrode having a barrier layer for preventing any diffusion of a soldering material into the via hole.

An eighth aspect of the present invention is a semiconductor apparatus comprising: a semiconductor substrate; a first surface of the semiconductor substrate on which a semiconductor device is formed; a second surface opposite to the first surface of the semiconductor substrate; a plated heat sink provided on the second surface; a barrier layer, provided on a surface of the plated heat sink, for preventing any diffusion of a soldering material into the plated heat sink.

In the semiconductor apparatus (the semiconductor chip) according to the present invention, the metal junction layer conformable to the soldering material and the barrier layer capable of inhibiting any diffusion of the soldering material are formed on the back electrode, thus providing the stable semiconductor apparatus in which no breakage such as a crack occurs from the via hole on the semiconductor substrate, and therefore, no influence is exerted on the semiconductor device formed on the obverse of the semiconductor substrate.

DETAILED DESCRIPTION OF THE PREFERRED EMBODIMENTS

A semiconductor apparatus according to the present invention adopts the above-described technical arrangements. More particularly, a semiconductor apparatus according to the present invention is featured in that a metal junction layer conformable to a soldering material and a barrier layer capable of inhibiting any diffusion of the soldering material inside a via hole are formed in sequence in order to prevent any deterioration of characteristics of the semiconductor apparatus caused by diffusion of the soldering material into a metal provided in a via hole in the semiconductor apparatus or into the back electrode thereof.

Furthermore, a first object of the present invention is to prevent any degradation of a wiring layer formed inside of the via hole caused by impregnation of the soldering material; and a second object of the present invention is to prevent any degradation of a heat sink layer caused by the impregnation of the soldering material.

Additionally, the semiconductor device according to the present invention may be not only a three-terminal device such as a field-effect transistor (FET), a bipolar transistor (BT) or a hetero-bipolar transistor (HBT) but also a two-terminal device such as a laser diode, a rectifier diode or a resistor, or a multi-terminal device. Moreover, the semiconductor device according to the present invention may be an integrated circuit consisting of a plurality of semiconductor devices, an analog integrated circuit including an inductor or a capacitor, or a microwave integrated circuit.

(First Embodiment)

Preferred embodiments of arrangements of a semiconductor apparatus according to the present invention will be described below in detail in reference to the accompanying drawings.

Figure 1:
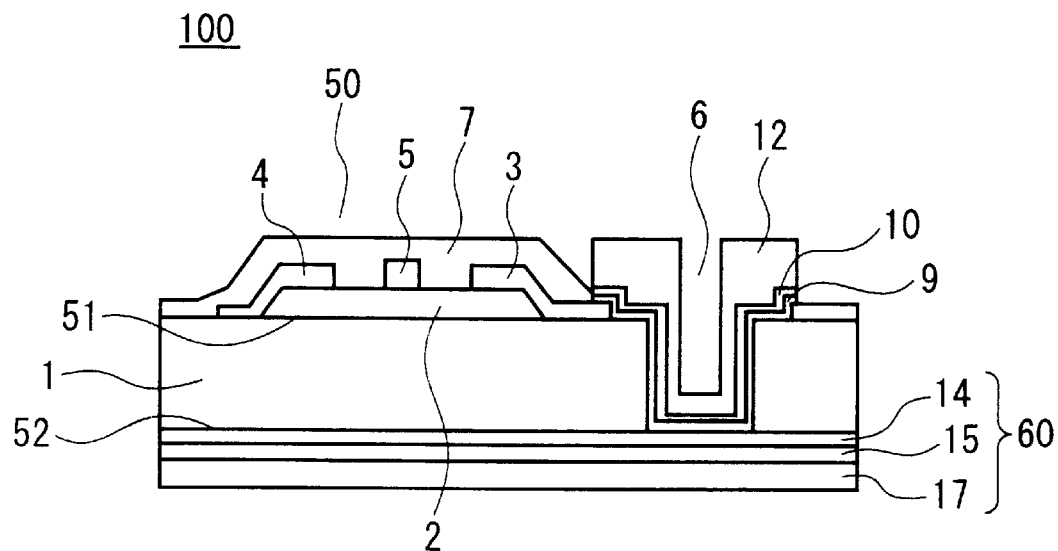
FIG. 1 is a cross-sectional view showing the semiconductor device of the first embodiment according to the present invention.

FIG. 1 is a cross-sectional view schematically showing a semiconductor apparatus (a semiconductor chip) in a first preferred embodiment according to the present invention. In FIG. 1, there is illustrated a semiconductor apparatus 100 comprising: a semiconductor substrate 1; a first surface 51 of the semiconductor substrate 1 on which a semiconductor device 50 is formed; a second surface 52 opposite to the first surface 51 of the semiconductor substrate 1; a via hole 6 penetrating through the semiconductor substrate 1 from the first surface 51 to second surface 52; an electrode 60, provided on the second surface 52, connecting to the via hole 6; wherein the electrode 60 having a barrier layer 15 for preventing any diffusion of a soldering material into the via hole 6.

Additionally, the electrode 60 comprises a metal junction layer 17 which enhances a solder wettability of the barrier layer 15.

Figure 7:
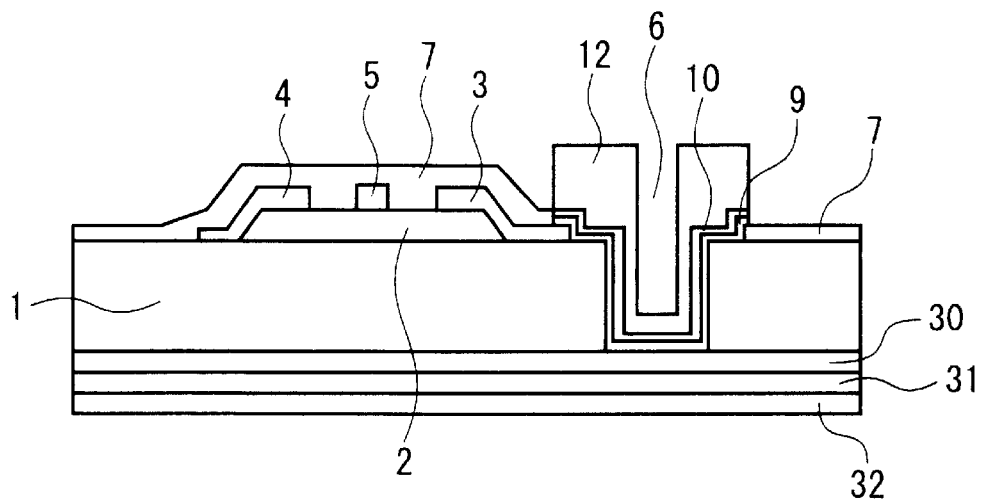
FIG. 7 is a cross-sectional view showing the conventional semiconductor device.
Figure 8:
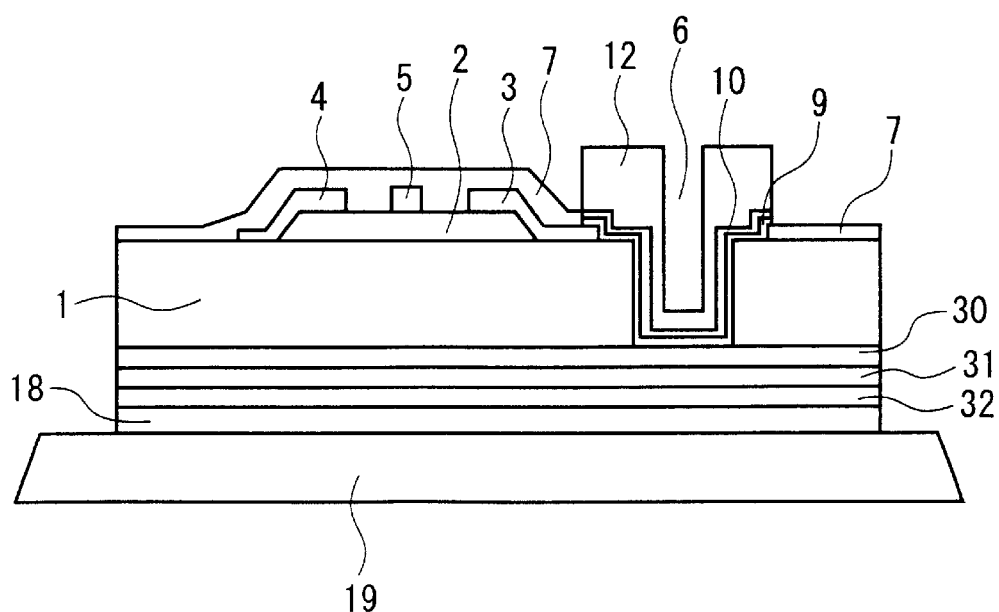
FIG. 8 is a cross-sectional view showing the semiconductor apparatus in which the conventional semiconductor device is mounted on a package.
Figure 9:
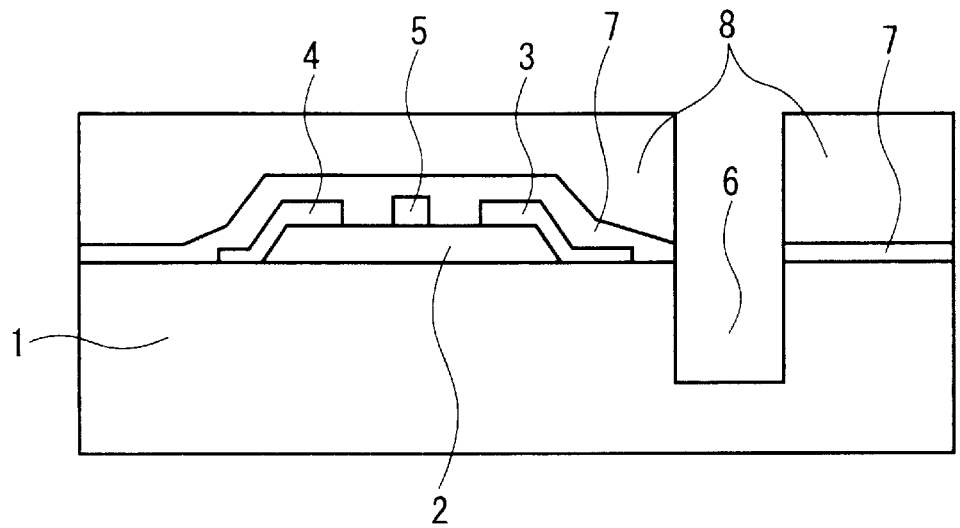
FIG. 9 is a cross-sectional view showing the first fabricating step of the semiconductor apparatus in the prior art.
Figure 10:
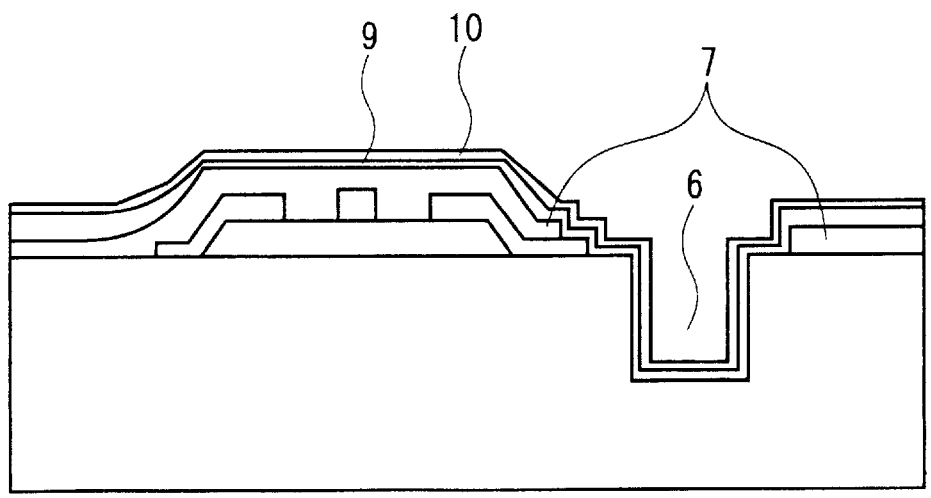
FIG. 10 is a cross-sectional view showing the second fabricating step of the semiconductor apparatus in the prior art.
Figure 11:
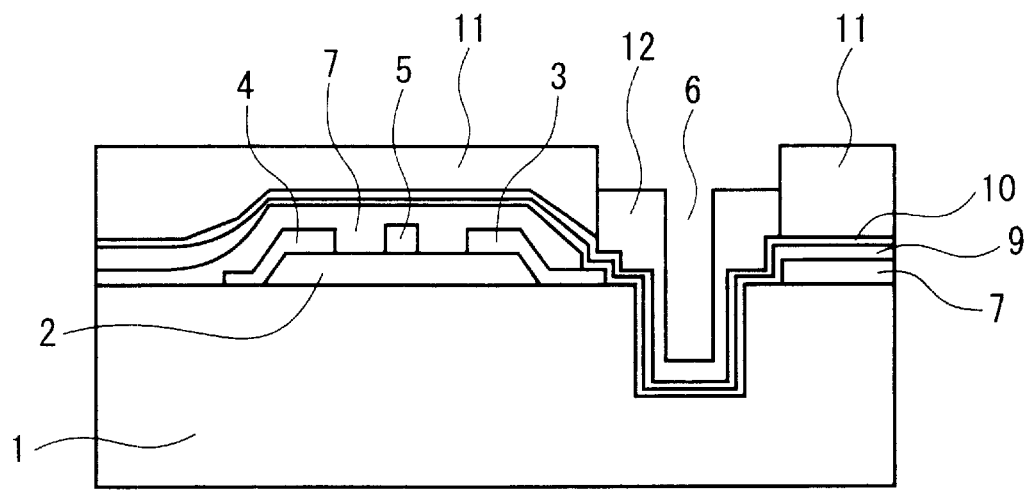
FIG. 11 is a cross-sectional view showing the third fabricating step of the semiconductor apparatus in the prior art.
Figure 12:
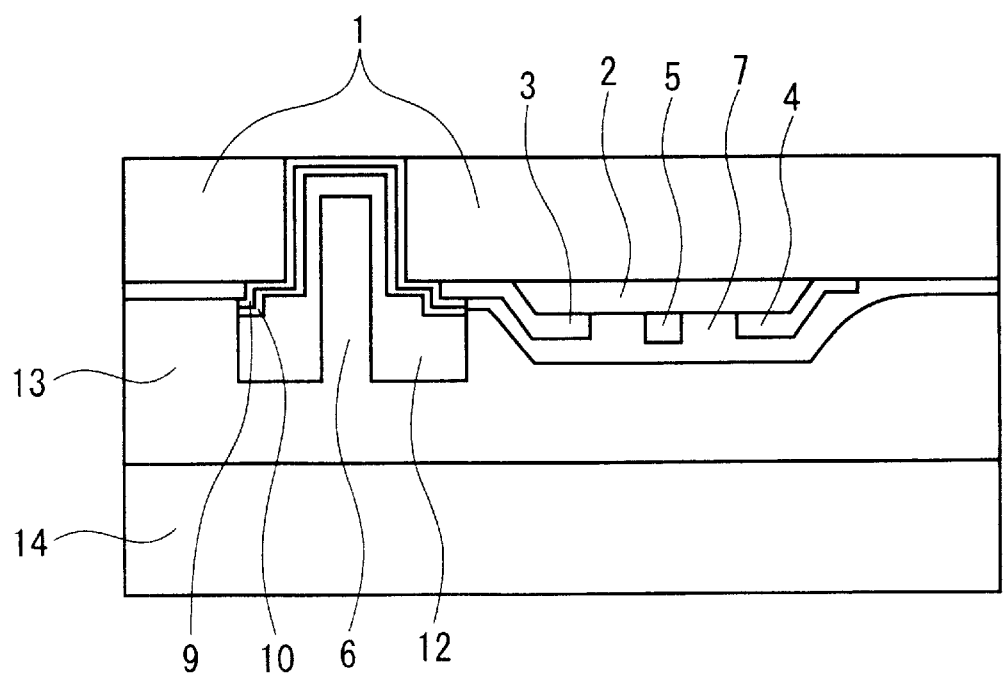
FIG. 12 is a cross-sectional view showing the fourth fabricating step of the semiconductor apparatus in the prior art.
Figure 13:
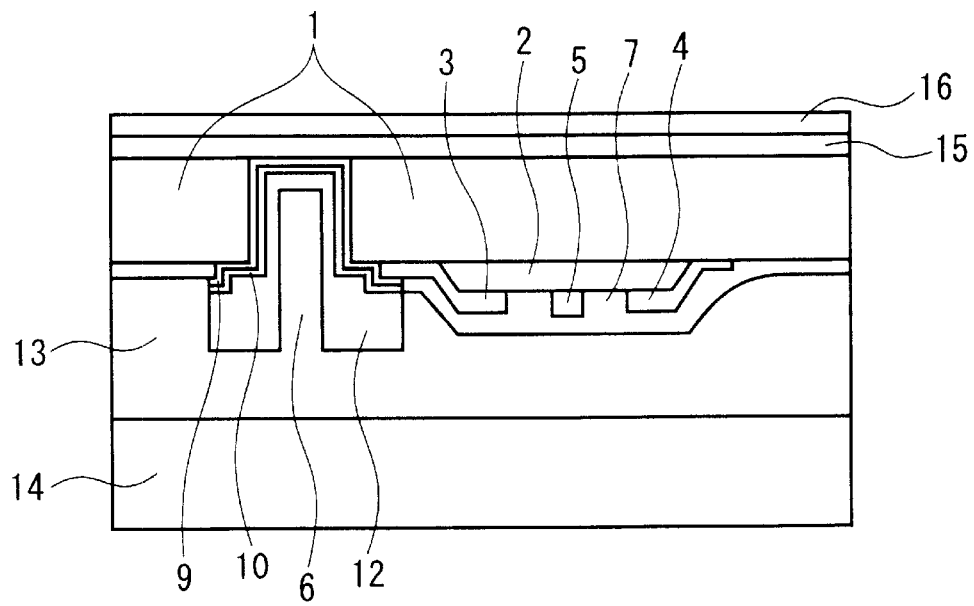
FIG. 13 is a cross-sectional view showing the fifth fabricating step of the semiconductor apparatus in the prior art.
Figure 14:
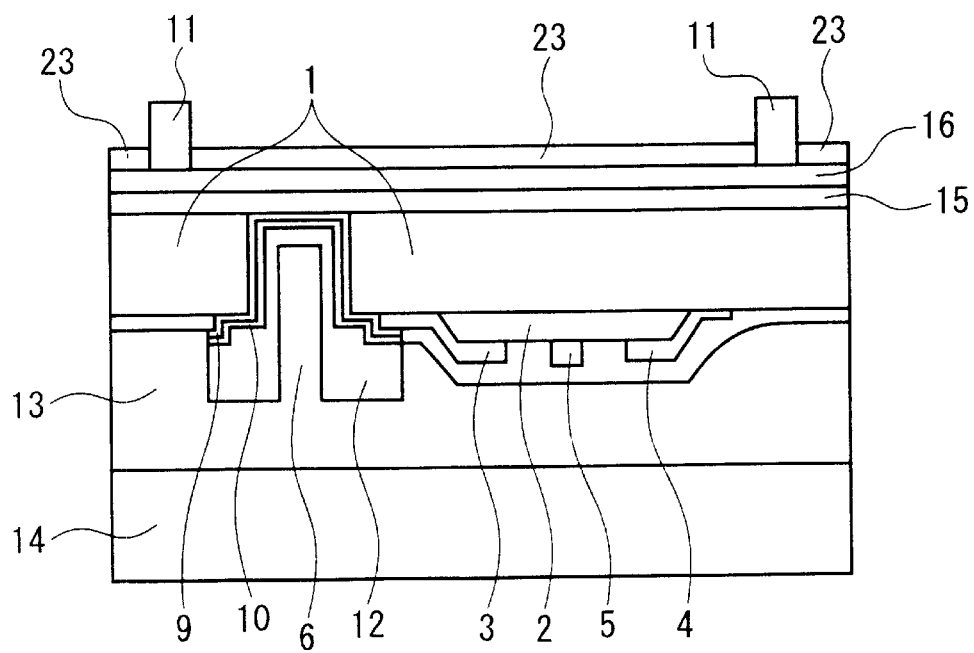
FIG. 14 is a cross-sectional view showing the sixth fabricating step of the semiconductor apparatus in the prior art.
Figure 15:
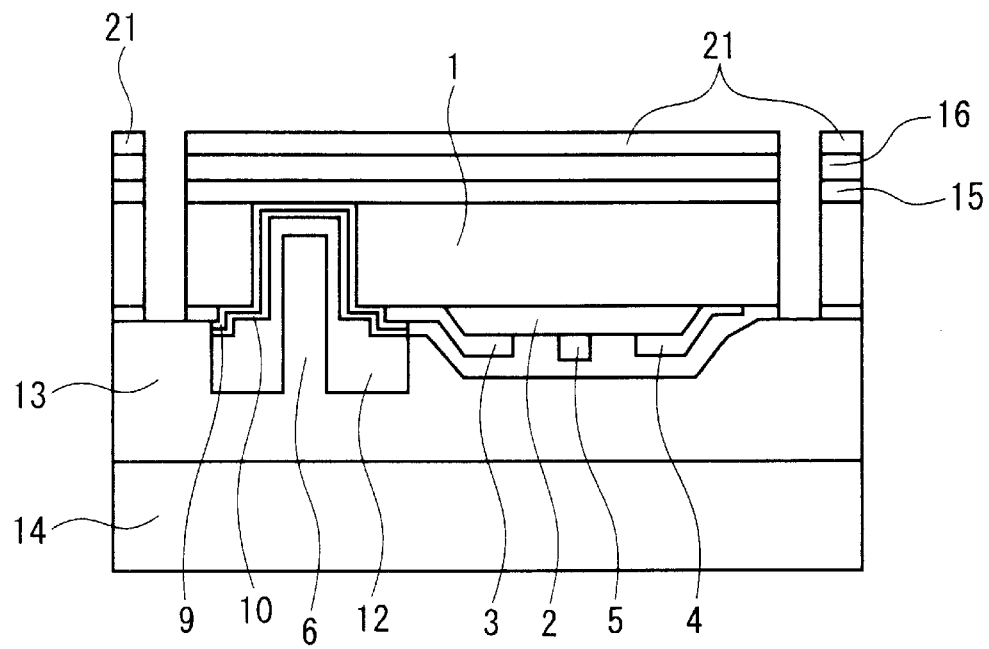
FIG. 15 is a cross-sectional view showing the seventh fabricating step of the semiconductor apparatus in the prior art.

Namely, the basic arrangement of the semiconductor apparatus 100 according to the present invention is the same as that of the above-described semiconductor apparatus in the prior art shown in FIG. 7 except for the above-described barrier layer 15. Consequently, the same members as those of the semiconductor apparatus shown in FIG. 7 are designated by the same reference numerals and therefore, their specific explanation will be omitted here.

Hereinafter, explanation will be made on specific examples of the detailed arrangement of the semiconductor apparatus according to the present invention and a method for fabricating the same.

Namely, in a first specific example of the semiconductor apparatus 100 according to the present invention, as shown in FIG. 1, the semiconductor apparatus (the semiconductor chip) 100 is identical to that in the prior art in the obverse of the substrate including the via hole 6, but is different in the arrangement of the metal layer at the reverse 52 of the substrate 1.

Specifically, the FET semiconductor device 50 and its circuit are formed on the GaAs semiconductor substrate 1 having the thickness of 100 µm; the via hole 6 having a diameter of 40 µm is formed at a predetermined position of the semiconductor substrate 1 penetrating through the substrate from the obverse 51 down to the reverse 52; the wiring unit consisting of the Ti layer 9 in the thickness of 100 nm, the Au layer 10 in the thickness of 400 nm and the Au-plating layer 12 in the thickness of 2 µm are formed inside of the via hole 6 and on the obverse 51 of the substrate; and the Ti layer 14 serving as the metal portion for close contact in the thickness of 100 nm, the Pt layer 15 in the thickness of 200 nm functioning as the barrier layer and the Au layer 17 in the thickness of 400 nm, which constitute the back electrode, are laminated at the reverse 52 of the semiconductor substrate 1.

In the present specific example, the Ti layer 14, the Au layer 17 and the Pt layer 15 other than the Au-plating layer 12 are formed by sputtering vapor deposition.

Figure 2:
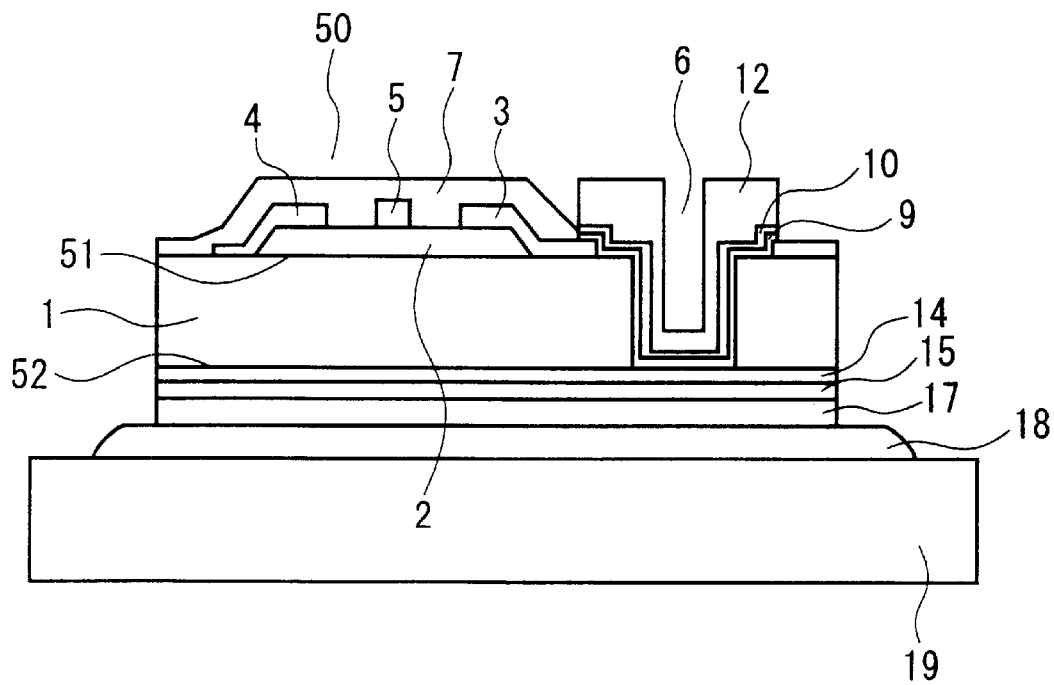
FIG. 2 is a cross-sectional view illustrating the semiconductor apparatus in which the semiconductor device of the first embodiment is mounted on a package.

FIG. 2 is a cross-sectional view showing the semiconductor apparatus (the semiconductor chip) 100 mounted on the package 19 in the first specific example according to the present invention.

In FIG. 2, the Au layer 17 formed at the bottom surface of the semiconductor chip 100 is bonded to and mounted on one surface of the package 19 made of a Cu plate plated with Au by using the soldering material 18 of AuSn.

In this case, the package 19 is placed on a hot plate (a heating plate) which is heated up to 350° C., so that the soldering material 18 placed on one surface of the package 19 is melted, and then, the semiconductor chip 100 is placed on the melted soldering material 18 using a vacuum chuck, to be slightly vibrated to be brought into contact with the soldering material 18, and thus, the package 19 is separated from the hot plate, followed by cooling, thereby completing a mounting work.

In the present specific example, the semiconductor chip 100 is heated for about 30 sec. Thereafter, electrode pads provided on the obverse 51 of the semiconductor chip 100 and pads of the package 19 are wired by a bonding device and connected to each other by means of an Au wire. Incidentally, PbSn, ZnSn may be used as the soldering material.

Figure 3:
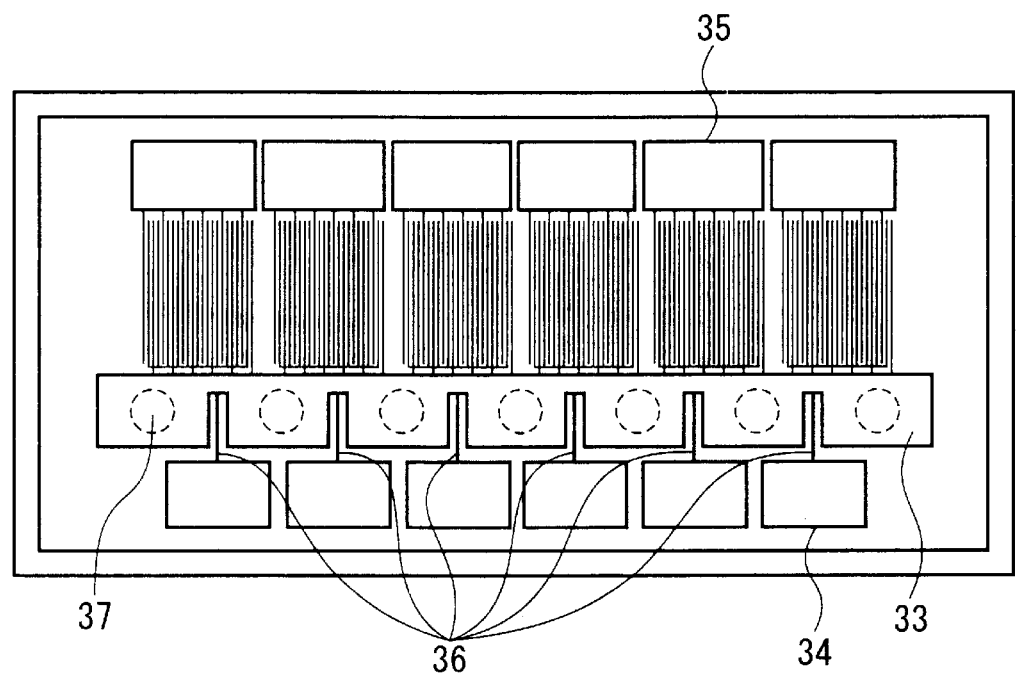
FIG. 3 is a plan view showing the semiconductor device of the first embodiment according to the present invention.

FIG. 3 is a plan view showing the above-described semiconductor apparatus (the semiconductor chip) 100 in the first specific example according to the present invention, and illustrating the semiconductor apparatus in which a FET for a high output or a switching FET which is low in resistance at the time of ON is formed.

Namely, in FIG. 3, linear (finger-like) electrodes are configured such that the sources and the drains are alternately arranged in this order between the gates: for example, the source, the gate, the drain, the gate, the source, the gate, the drain, the gate, the source and so on. The plurality of drains, gates and sources are connected together to drain electrode pads 35, gate electrode pads 34 and source electrode pads 33, respectively, thus constituting one cell.

A plurality of above-described cells are laterally arranged in one chip. A plurality of sources are connected on the obverse of the semiconductor chip for the purpose of grounding, the source electrode pads 33 are disposed in such a manner as to hold gate drawing wirings 36 therebetween, and further, via holes 37 for the substrate are formed under the source electrode pads 33.

The FET herein is of a normally on type in which a gate threshold value is negative. One linear gate electrode has a length of 100 µm; the via hole formed at the source pad has a diameter of about 40 µm; and the resistance of the via hole is 0.1 Ω or less.

A description will be given below of the experiment results of the comparison of effects produced according to the present invention with those produced in the prior art.

In the conventional semiconductor apparatus in a comparative example, the back electrode is formed by only the Ti layer 14 having the thickness of 100 nm and the Au layer having the thickness of 400 nm and did not include any PT layer as the barrier layer.

The semiconductor apparatuses 100 according to the present invention as shown in FIG. 1 and the semiconductor apparatuses in the comparative example were fabricated in the number of 100, respectively, and then, were assembled in the packages. Thus, the electric characteristics were measured.

As a result, the semiconductor apparatuses according to the present invention were uniform without any deficiency of the characteristics. In contrast, three out of the conventional semiconductor apparatuses showed the deficiency that a drain current could not cut off by a gate voltage. When the surface of each of the deficient products was observed, a crack occurred between the adjacent via holes, and a gate wiring passing therebetween was cut, thereby preventing any transmission of the gate voltage to a part of the FET cells.

In observing around the via hole machined in cross section by a focused ion beam (an FIB), the soldering material intruded into the via hole. In the surface observation, the Au-plating wiring in the vicinity of the via hole was discolored from brilliant gold to dark yellow. As a result of evaluation based on the discoloring of the via hole, 57 out of the 100 conventional products were discolored. In contrast, no discoloring was observed in the products according to the present invention.

Subsequently, with respect to the above-described semiconductor apparatuses 100 according to the present invention, the semiconductor apparatus was fabricated such that the thickness of the Ti film layer 14 serving as the metal portion constituting the back electrode of the substrate 1 was varied from 100 nm in the prior art gradually up to 150 nm, 200 nm, 250 nm and 300 nm, and then, 100 samples were assembled. And then, variations in characteristics influenced by the thickness of the Ti film layer 14 were examined.

As a result, the deterioration of the characteristics and the discoloring of the via hole were rapidly reduced as the thickness of the Ti film layer 14 was increased. In particular, the effect could be confirmed when the thickness was set to 200 nm or more, and further, no abnormality was observed when the thickness was set to 300 nm. From this result, it was revealed that the barrier property with respect to the soldering material could be confirmed by increasing the thickness of the Ti layer.

Next, in the above-described specific example according to the present invention, the kind of metal constituting the barrier layer 15 was examined in various manners.

In this case, the Ti layer 14 having the thickness of 10 nm and the Au layer 17 having the thickness of 400 nm are provided on the reverse 52 of the substrate 1, and further, the thickness of the barrier layer 15 provided between the layers 14 and 17 was set to 300 nm. Thereafter, the metal element composing the barrier layer was varied in experiments.

The film formation was performed by sputtering vapor deposition or electron gun vapor deposition.

As a result of the above experiments, the barrier effect could be observed with the following metals: vanadium (V), chromium (Cr), zirconium (Zr), niobium (Nb), molybdenum (Mo), ruthenium (Ru), rhodium (Rh), tantalum (Ta), tungsten (W), and rhenium (Re), osmium (Os), iridium (Ir) and platinum (Pt).

From the results of the above described various experiments, it was found that the metals having a melting point of as high as 1700° C. tended to achieve the excellent barrier property.

The resistance of the via hole in each of the elements was 0.1 Ω or less.

Furthermore, with respect to the semiconductor apparatus 100 according to the present invention, the kind of element of the barrier metals containing silicon (Si) as the material composing the barrier layer 15 was examined.

In other words, as described above, the metal portion disposed on the reverse 52 of the substrate 1 in the semiconductor apparatus 100 was composed of the Ti layer 14 having the thickness of 100 nm and the Au layer 17 having the thickness of 400 nm, and further, the thickness of the barrier layer 15 provided between the layers 14 and 17 was set to 300 nm. Thereafter, the metal element containing Si composing the barrier layer was varied in experiments.

In the above-described experiments, film formation of barrier metal containing Si was performed by co-sputtering vapor deposition. A target of Si and a target of a single element placed on a rotary mount supporting the substrate thereon were simultaneously sputtered, thereby forming a silicide metal film.

There was a tendency of enhancing the barrier effect with respect to Sn by adding Si. The thickness of the barrier layer containing Si was set to 200 nm, and the content of Si ranged from 30% to 60%.

As a result, the barrier effect was observed with respect to the following metals: W.Si, Mo.Si, Cr.Si, Ta.Si, Nb.Si, V.Si, Ti.Si, Pt.Si, Pd.Si and Ni.Si. Namely, the barrier effect could be enhanced by adding Si into a single element such as Ni or Pd, which is poor in the barrier effect.

Here, although no sputtering experiment was performed with respect to a target of very expensive metal or a target that was hardly fabricated, silicide metals with the metallic elements used in the above-described experiments is construed as producing the barrier effect. Furthermore, the barrier effect was enhanced as the content of Si was increased, but the resistance became high. Therefore, the content of Si also was adjusted in accordance with the thickness of the barrier layer. The silicide metal films made of the above-described elements showed a resistance of 0.1 Ω or less at the via hole.

In the meantime, in the semiconductor apparatus 100 according to the present invention, elements of barrier metals containing nitrogen (N) were examined as the material composing the barrier layer 15.

In other words, as described above, the metal layers disposed at the reverse 52 of the substrate 1 in the semiconductor apparatus 100 were formed by the Ti layer 14 in the thickness of 100 nm and the Au layer 17 in the thickness of 400 nm, and the thickness of the barrier layer 15 interposed between the layers 14 and 17 was set to 300 nm. Thereafter, the elements of metals containing nitrogen N composing the barrier layer were varied in experiments.

In the above-described experiments, the barrier layer containing nitrogen N was formed by adding 10% to 30% of nitrogen at the flow rate to gaseous argon (Ar) for sputtering.

As a result, there also was a tendency of enhancing the barrier effect with respect to Sn by adding nitrogen. In the case where the thickness of the barrier layer containing nitrogen was set to 200 nm, the barrier effect was observed with respect to the following metals: W.N, Mo.N, Cr.N, Ta.N, Nb.N, V.N and Ti.N.

Here, although no sputtering experiment was performed with respect to a target of very expensive metal or a target, which was hardly fabricated, nitride metals with the metallic elements are construed as producing the barrier effect from the above-described experiment result. Furthermore, the barrier effect was enhanced as the content of nitrogen was increased, but the resistance became high. Therefore, the content of nitrogen also was adjusted in accordance with the thickness of the barrier layer. The nitride metal films made of the above-described elements showed a resistance of 0.1 Ω or less at the via hole.

Moreover, in the semiconductor apparatus 100 according to the present invention, the via hole 6 was sputtered at the obverse thereof with nickel (Ni) in the thickness of 200 nm, thereby forming a power supplying layer, followed by plating with copper (Cu) in the thickness of 3 μm.

Thereafter, the reverse 52 of the substrate 1 was polished to expose the end of the via hole 6, and then, the Ni layer in the thickness of 100 nm, the Cu layer in the thickness of 300 nm and the Ni layer in the thickness of 200 nm were vapor-deposited at the reverse 52 of the substrate 1 by sputtering vapor deposition, thus forming the semiconductor chip.

Subsequently, the semiconductor chip 100 was bonded to the package 19 at about 350° C. with the soldering material containing zinc (Zn) and tin (Sn) or the soldering material containing lead (Pb) and tin (Sn).

Also in this case, the diffusion of the soldering material into the via hole 6 was observed.

In view of this, the back layers were formed by the Ni layer in the thickness of 100 nm, the Ni-Si layer as the barrier layer in the thickness of 300 nm, the Cu layer in the thickness of 300 nm and the Ni layer in the thickness of 200 nm.

Thus, it was possible to prevent any diffusion of the soldering material into the via hole 6.

According to the present invention, the positional relationship between the above-described metal layer and the barrier layer is not particularly specified, and therefore, it may be arbitrarily determined as described above.

(Second Embodiment)

Next, a description will be given of a second preferred embodiment of the semiconductor apparatus 100 according to the present invention.

As described already, Au has been thickly plated as the alleviation metal layer (i.e., the PHS layer) at the reverse of the chip in the prior art. Such thick Au-plating is adopted in the case of the device of a high output with much heat generation. An object of the formation of the PHS.Au-plated layer is to fast radiate heat generated in the device and absorb a stress generated by the expansion of the semiconductor substrate caused by the heat generation in the device by the layer made of soft gold.

However, the soldering material has been frequently diffused in the above-described Au-plated PHS layer requiring softness in the heat sink layer in the prior art. When the alleviation metal layer is hardened or a crack occurs accordingly, the function of alleviating a distortion is lost, and simultaneously, a heat conducting function also is degraded, thereby deteriorating the reliability of a product.

This problem arises irrespectively of the formation of the via hole in the substrate. In the case where the via hole is formed in the substrate, tin (Sn) contained in the soldering material is naturally diffused in the via hole, thereby breaking the wiring layer inside of the via hole, thereby leading to the deterioration of the reliability in the same manner.

As described above, the second embodiment according to the present invention is directed to solve the above-described problem experienced in the case where the heat sink layer or the thicker back electrode, for example, is formed at the reverse of the substrate in the semiconductor apparatus.

Figure 4:
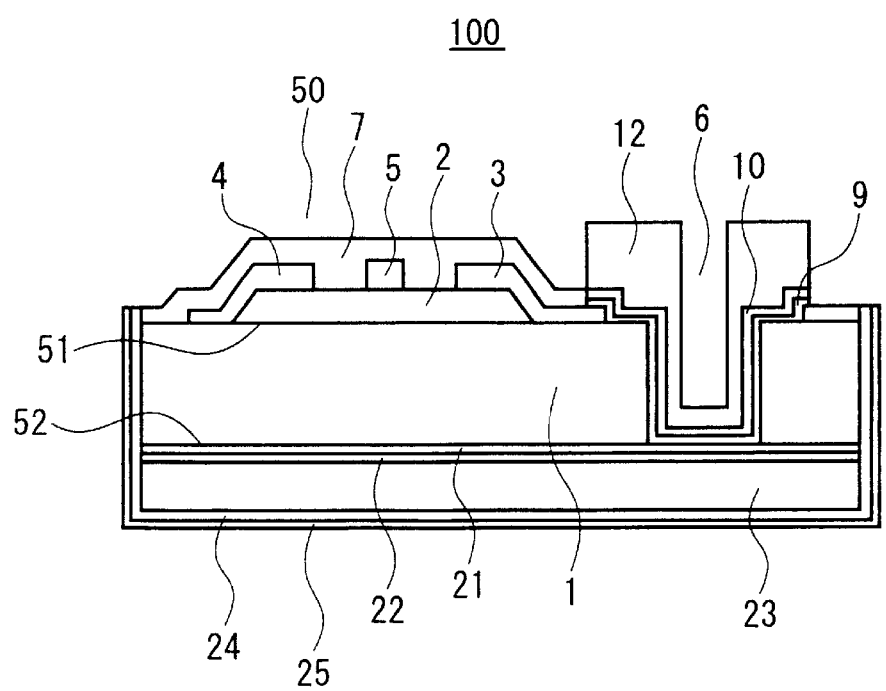
FIG. 4 is a cross-sectional view showing the semiconductor device of the second embodiment according to the present invention.

Namely, as shown in the schematic cross-sectional view of FIG. 4, in the semiconductor apparatus (the semiconductor chip) in the second embodiment according to the present invention, a FET semiconductor device 50 and its circuit are formed on a GaAs semiconductor substrate 1 in the thickness of 50 μm; a via hole 6 having a diameter of 40 μm is formed at a predetermined position of the semiconductor substrate 1 through the substrate from an obverse 51 down to a reverse 52; a Ti layer 9 in the thickness of 100 nm, an Au layer 10 in the thickness of 400 nm and a wiring plated with Au 12 in the thickness of 2 μm are formed inside of the via hole 6 from the obverse 51 of the substrate; and a Ti layer 21 in the thickness of 100 nm and an Au layer 22 in the thickness of 400 nm are vapor-deposited by sputtering at the reverse 52 of the semiconductor substrate 1. The resultant layer is used as a power supplying layer; the surroundings of a chip are removed with a photoresist mask, thereby forming a heat sink layer (a PHS layer) 23 consisting of an Au-plating layer in the thickness of 10 μm; and further, a barrier layer is covered with a W film layer 24 in the thickness of 400 nm and an Au film layer 25 in the thickness of 400 nm inclusive of the side surface of the layer 23.

Figure 5:
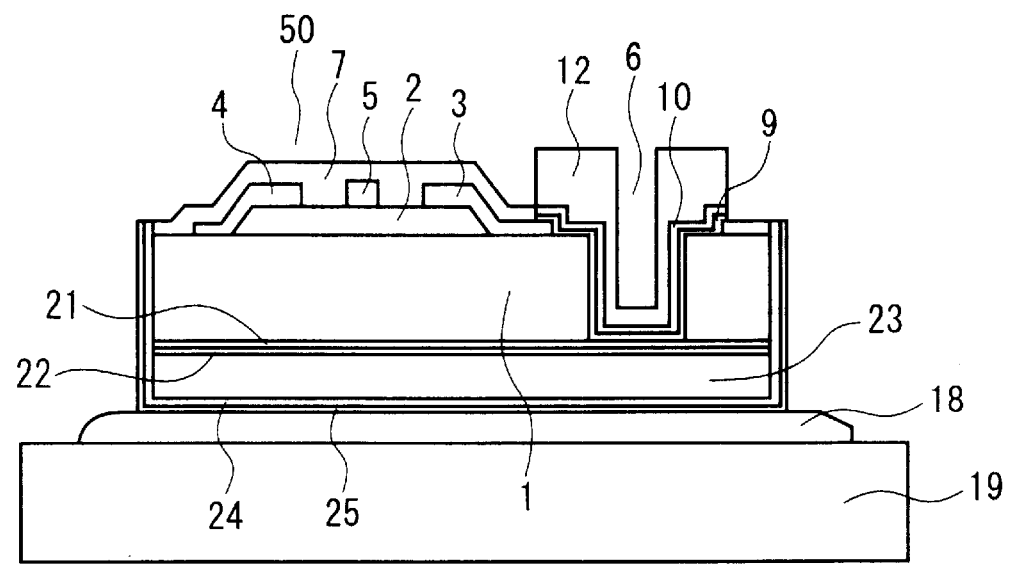
FIG. 5 is a cross-sectional view illustrating the semiconductor apparatus in which the semiconductor device of the second embodiment is mounted on a package.

FIG. 5 is a schematically cross-sectional view showing the semiconductor apparatus (the semiconductor chip) mounted on a package 19 in the second embodiment according to the present invention. An Au layer 25 formed at the bottom surface of the semiconductor chip is bonded to and mounted on one surface of the package 19 made of a CuW plate plated with Au with a soldering material 18 of AuSn. The package 19 is placed on a hot plate (a heating plate) which is heated up to 350° C., so that the soldering material placed on the bottom surface of the package is melted to be thus brought into close contact. The diffusion of the soldering material is prevented by the barrier metal W, thus preventing alloying or hardening caused by the diffusion of soldering material within the PHS layer.

Figure 6:
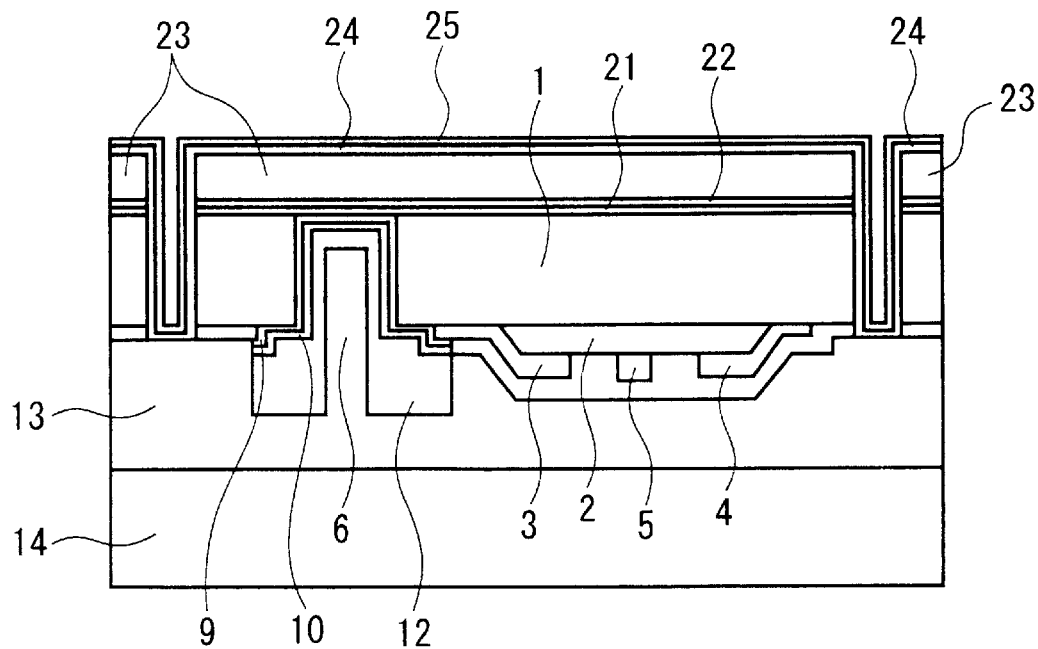
FIG. 6 is a cross-sectional view illustrating a fabricating method in dicing the semiconductor apparatus of the second embodiment according to the present invention.
Figure 16:
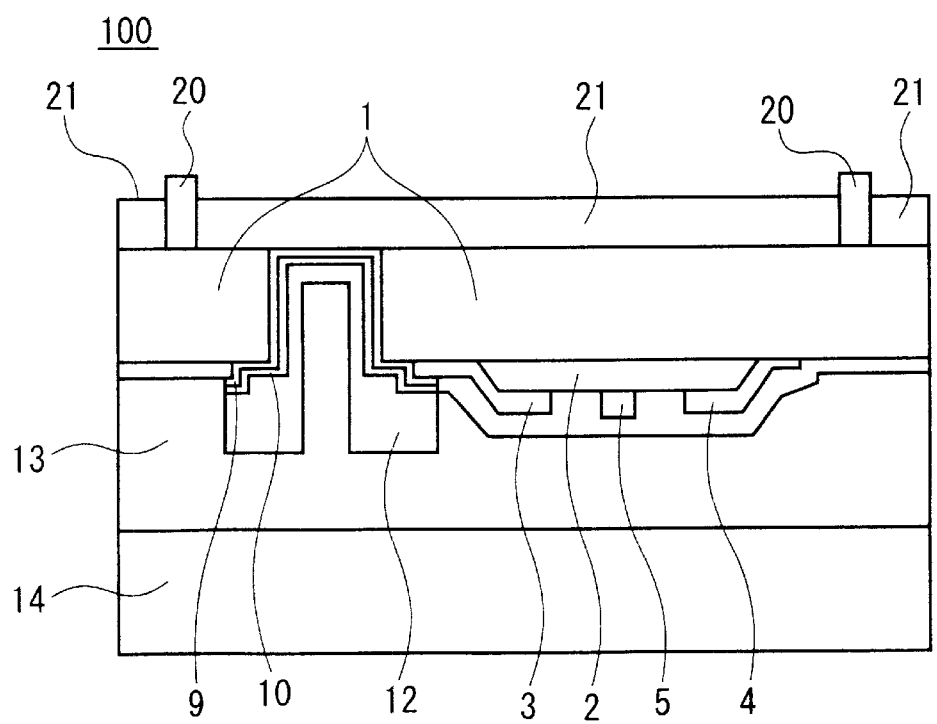
FIG. 16 is a cross-sectional view showing another fabricating step of the semiconductor apparatus in the prior art.
Figure 17:
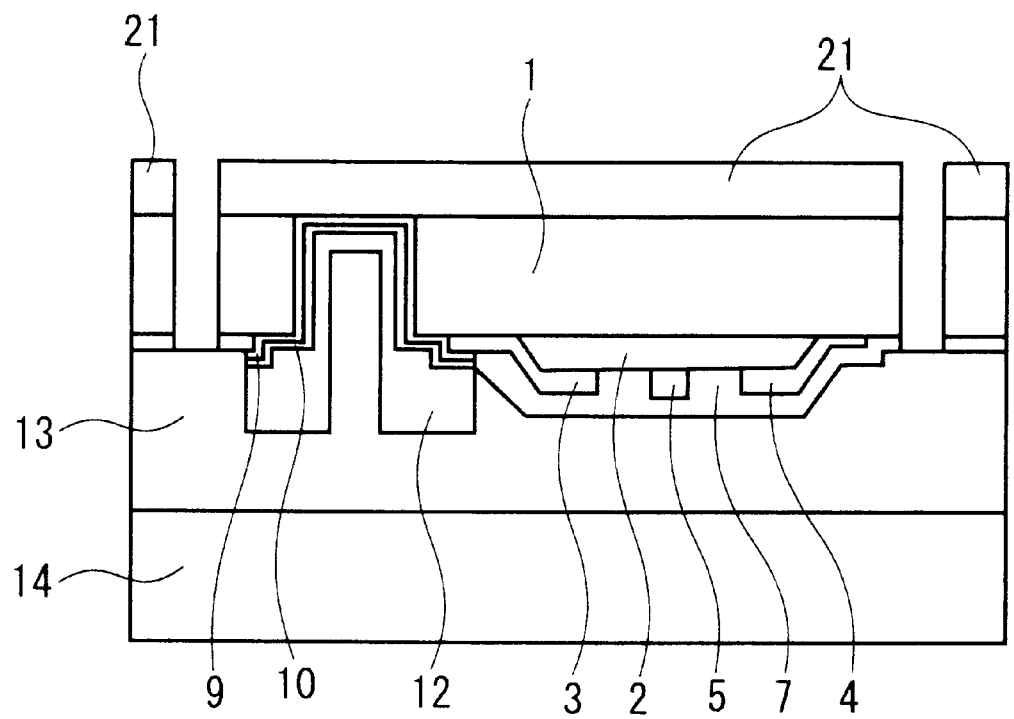
FIG. 17 is a cross-sectional view illustrating the fabricating step of the semiconductor apparatus shown in FIG. 16.

In a method for fabricating the semiconductor apparatus (the semiconductor chip), as shown in FIG. 6, the Au-plated PHS layer 23 is formed by using a mask of the photoresist film in such a manner as to remove a cutting region of the semiconductor substrate. After the cutting region is removed by etching, the W film 24 in the thickness of 400 nm serving as the barrier layer and the Au film 25 in the thickness of 400 nm are formed by sputtering vapor deposition, in the same manner as the conventional fabricating method as shown in FIGS. 16 and 17. In this way, the side surface of the PHS layer and the side surface of the semiconductor substrate are covered. Thereafter, the metallic film in the separated region is cut by dicing, to be thus separated into the semiconductor chips. After this, a wax 13 is melted to provide the semiconductor chips one by one, like in the prior art.

The semiconductor apparatus (the semiconductor chip) in the second embodiment according to the present invention was compared in experiments with that in the prior art.

Neither the W barrier layer nor the Au layer, which have been described above, were added in a conventional product.

The semiconductor chip according to the present invention and the semiconductor chip in the prior art were assembled in a ceramic package, followed by an energization acceleration experiment at high temperature. A drain voltage was set to 8V and a drain current was set to 4A, and further, the ambient was heated such that the temperature of a FET channel became 120° C. As for the degradation in the conventional product, the drain current was decreased by 10% or more when 10 hours elapsed, and was further decreased as the time elapsed. In contrast, the product according to the present invention revealed no variation even in 1000 hours, and thus, exhibited high reliability.

In addition to Au, which has been conventionally known, Cu may be used for the PHS layer for alleviating the stress. Cu also has flexibility unless other metals or the like are diffused to be alloyed therewith. In order to protect the PHS layer, the barrier layer may be formed on the side of the semiconductor substrate and outside of the PHS layer.

Thus, the soldering material can be inhibited by the barrier layer 24 outside of the PHS layer 23.

The barrier layer or the soldering material is made of the same material as that described in the first embodiment.

As described above, the second embodiment of the present invention is a semiconductor apparatus 100 comprising: a semiconductor substrate 1; a first surface 51 of the semiconductor substrate 1 on which a semiconductor device 50 is formed; a second surface 52 opposite to the first surface 51 of the semiconductor substrate 1; a plated heat sink 23 provided on the second surface 52; a barrier layer 24, provided on a surface of the plated heat sink 23, for preventing any diffusion of a soldering material into the plated heat sink 23.

What is claimed is:

1. A semiconductor apparatus comprising:
   a semiconductor substrate;
   a first surface of said semiconductor substrate on which a semiconductor device is formed;
   a second surface opposite to said first surface of said semiconductor substrate;
   a via hole penetrating through said semiconductor substrate from said first surface to second surface;
   an electrode, provided on said second surface, connecting to said via hole;
   wherein said electrode having a barrier layer for preventing any diffusion of a soldering material into said via hole.

2. The semiconductor apparatus according to claim 1, wherein said electrode comprising a plurality of conductive metal layers.

3. The semiconductor apparatus according to claim 1, wherein said electrode having a metal junction layer which enhances a solder wettability of said barrier layer.

4. The semiconductor apparatus according to claim 1, wherein said electrode comprising: a Ti film layer formed on said second surface of said semiconductor substrate, said barrier layer formed on said Ti film layer and a metal junction layer for enhancing a solder wettability of said barrier layer.

5. The semiconductor apparatus according to claim 1, wherein said barrier layer is composed of at least one selected from the group consisting of vanadium (V), chromium (Cr), zirconium (Zr), niobium (Nb), molybdenum (Mo), ruthenium (Ru), rhodium (Rh), tantalum (Ta), tungsten (W), rhenium (Re), osmium (Os), iridium (Ir), platinum (Pt), silicides thereof and nitrides thereof.

6. The semiconductor apparatus according to claim 3, wherein said metal junction layer is bonded to a package of a semiconductor apparatus a via solder layer.

7. A semiconductor apparatus comprising:
   a semiconductor substrate;
   a first surface of said semiconductor substrate on which an FET is formed;
   a second surface opposite to said first surface of said semiconductor substrate;
   a via hole penetrating through said semiconductor substrate from said first surface to second surface and connecting to a source electrode of said FET;
   an electrode, provided on said second surface, connecting to said via hole;
   wherein said electrode having a barrier layer for preventing any diffusion of a soldering material into said via hole.

8. The semiconductor apparatus according to claim 7, wherein said electrode comprising a plurality of conductive metal layers.

9. The semiconductor apparatus according to claim 7, wherein said electrode having a metal junction layer which enhances a solder wettability of said barrier layer.

10. The semiconductor apparatus according to claim 7, wherein said electrode comprising: a Ti film layer formed on said second surface of said semiconductor substrate, said barrier layer formed on said Ti film layer and a metal junction layer, formed on said barrier layer, for enhancing a solder wettability of said barrier layer.

11. The semiconductor apparatus according to claim 7, wherein said barrier layer is composed of at least one selected from the group consisting of vanadium (V), chromium (Cr), zirconium (Zr), niobium (Nb), molybdenum (Mo), ruthenium (Ru), rhodium (Rh), tantalum (Ta), tungsten (W), rhenium (Re), osmium (Os), iridium (Ir), platinum (Pt), silicides thereof and nitrides thereof.

12. The semiconductor apparatus according to claim 9, wherein said metal junction layer is bonded to a package of a semiconductor apparatus a via solder layer.

13. A semiconductor apparatus comprising:

a semiconductor substrate;

a first surface of said semiconductor substrate on which a semiconductor device is formed;

a second surface opposite to said first surface of said semiconductor substrate;

a plated heat sink provided on said second surface;

a barrier layer, provided on a surface of said plated heat sink, for preventing any diffusion of a soldering material into said plated heat sink.

14. The semiconductor apparatus according to claim 13, wherein said barrier layer is composed of at least one selected from the group consisting of vanadium (V), chromium (Cr), zirconium (Zr), niobium (Nb), molybdenum (Mo), ruthenium (Ru), rhodium (Rh), tantalum (Ta), tungsten (W), rhenium (Re), osmium (Os), iridium (Ir), platinum (Pt), suicides thereof and nitrides thereof.

15. The semiconductor apparatus according to claim 13, wherein a side surface of said plated heat sink is covered with said barrier layer.

16. The semiconductor apparatus according to claim 15, wherein a side surface of said semiconductor substrate is covered with said barrier layer.

17. The semiconductor apparatus according to claim 13, wherein said semiconductor apparatus further comprising a metal junction layer, provided on said barrier layer, for enhancing a solder wettability of said barrier layer.

18. The semiconductor apparatus according to claim 17, wherein said metal junction layer is bonded to a package of a semiconductor apparatus a via solder layer.

* * * * *